United States Patent [19]

Souetinov

[11] Patent Number: 6,147,568
[45] Date of Patent: Nov. 14, 2000

[54] RADIO-FREQUENCY VARIABLE ATTENUATOR

[75] Inventor: Viatcheslav Igor Souetinov, Swindon, Russian Federation

[73] Assignee: Mitel Semiconductor Limited, United Kingdom

[21] Appl. No.: 09/259,166

[22] Filed: Feb. 26, 1999

[30] Foreign Application Priority Data

Feb. 26, 1998 [GB] United Kingdom ............... 9804165

[51] Int. Cl.[7] .................................................. H03H 7/24
[52] U.S. Cl. .......................... 333/81 R; 330/284; 327/308
[58] Field of Search ........................ 333/81 R; 327/306, 327/308, 313, 425; 330/284

[56] References Cited

U.S. PATENT DOCUMENTS 3,902,077  8/1975  Takemura et al. ................. 327/308
4,055,818  10/1977  Gay ..................................... 327/308 X
4,564,863  1/1986  Chameroy et al. ................. 327/306 X Primary Examiner—Paul Gensler
Attorney, Agent, or Firm—Fish & Richardson P.C.

[57] ABSTRACT

A variable attenuator comprises bipolar transistors Q1 and Q2 connected in reverse parallel between a point 1 and ground potential G. The base electrodes of the transistors Q1 and Q2 are biased independently by a control circuit 3. The collector of transistor Q1 and the emitter of transistor Q2 are commonly connected to a bias voltage provided by resistor R2 and voltage source Vr. The attenuator provides means by which the linearity, gain, power handling capabilities and noise figure of a front-end receiver can be altered. The attenuator is susceptible to integration in, for example, a radio receiver front-end.

7 Claims, 2 Drawing Sheets

RADIO-FREQUENCY VARIABLE ATTENUATOR

The present invention relates to a radio-frequency variable attenuator, and is particularly although not exclusively concerned with a variable attenuator which can be integrated into radio-frequency receiver chips for cellular phones.

Radio-frequency receivers for cellular phones are required to generate very low levels of noise within the receiver for a given level of signal amplification, to have high sensitivity in the presence of large adjacent-channel signals and to have high power handling capability when the input signal is large. These requirements are often defined in terms of the noise figure; the gain; the third order interception point (IIP3), which reflects the linearity of the receiver, and the 1 dB compression point, which represents the maximum signal level that can be handled without compression or clipping. It is impossible to provide optimum values of all these parameters in any one set-up because very low noise figures and high gain are normally achieved at the expense of linearity and power handling. The latter two parameters may be improved by programmable attenuation at the input of the receiver, operable when the received signal-to-noise ratio is high enough for sensitivity to be sacrificed without loss of information. This attenuation can be realized by the introduction of a switched attenuator at the front end of the receiver, preferably before the first active device in order to achieve the maximum improvement in power handling.

At present, PIN diodes are normally used as current controlled RF attenuators, either in shunt or series configurations, the shunt configuration shown in FIG. 1 being preferred by reason of the simpler matching requirements. With this form of attenuator, the third order intercept and 1 dB compression points are improved in proportion to the attenuation. The PIN diode attenuator, however, does have significant disadvantages. Firstly, the diode is a discrete component which requires matching circuits and occupies precious area on the receiver printed circuit board, and secondly the control bias current has to be much higher than the signal current for linear attenuation, resulting in considerable power dissipation.

Alternatively, a gain-controlled low noise amplifier may be used at the front end of the receiver, which has the advantage that it may be integrated onto the receiver chip, but which has the disadvantage that its linearity and power handing do not improve in proportion to attenuation.

It is an aim of the present invention to provide a radio-frequency variable attenuator which can be integrated into an integrated circuit chip.

According to one aspect of the present invention, there is provided a radio-frequency variable attenuator comprising two bipolar transistors having their emitter/collector paths connected in reverse parallel between a point on a signal path and ground potential, with means to apply a bias voltage to said point on the signal path and means individually to bias the base electrodes of said transistors.

According to another aspect of the present invention there is provided a radio-frequency variable attenuator comprising first and second bipolar transistors each having emitter, base and collector electrodes, the collector electrode of the first transistor and the emitter electrode of the second transistor being connected together and to a point in a radio-frequency signal path, the emitter electrode of the first transistor and the collector electrode of the second transistor being connected together and to a radio-frequency signal return path, means to apply a bias voltage to the point in said radio-frequency signal path, and means individually to bias the base electrodes of said first and second transistors.

A radio-frequency variable attenuator in accordance with the present invention will now be described, by way of example, with reference to the accompanying drawings, of which:

Figure 1:
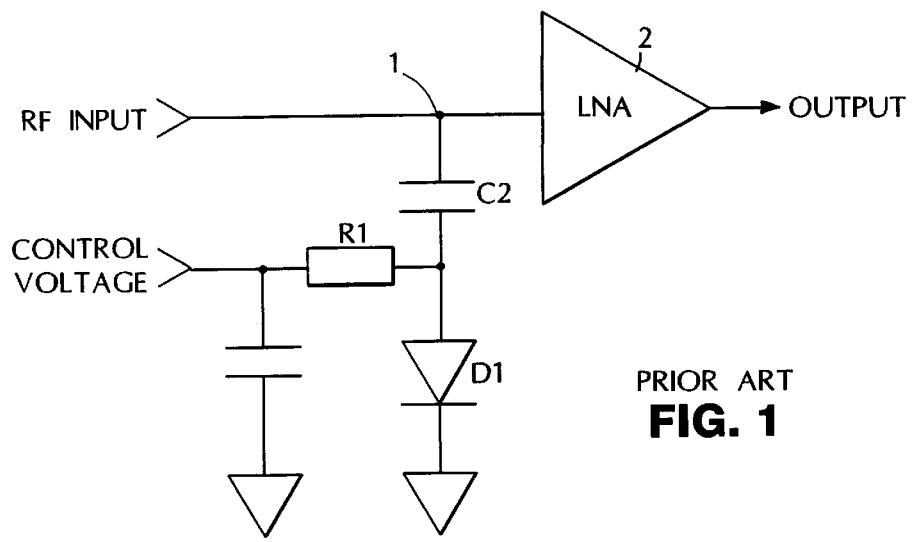
FIG. 1 shows schematically a known form of attenuator.

Referring first to FIG. 1, a known form of radio-frequency attenuator for a radio receiver comprises a PIN (p-type/intrinsic/n-type) diode D1 which is connected in series with a capacitor C2 between a point 1 in a radio-frequency signal input path to a low noise amplifier 2, and a signal return path (shown as ground potential). The diode D1 is arranged to be switched into conduction, when attenuation of the input signal is required, by means of a forward bias which is applied by way of a resistor R1.

Figure 2:
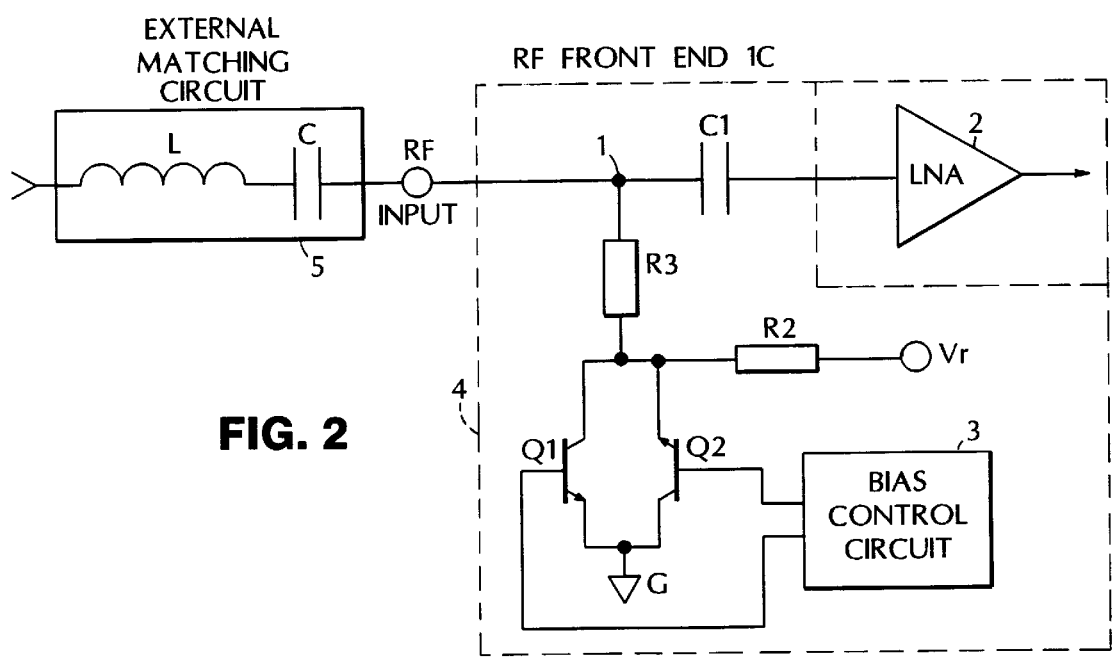
FIG. 2 shows schematically an attenuator in accordance with the present invention.

In FIG. 2, the series combination of capacitor and PIN diode is replaced by a pair of bipolar, n-p-n, transistors Q1 and Q2 which have their emitter/collector paths connected in reverse parallel between a point 1 in the radio-frequency signal input path and the signal return path G (again shown as ground potential). A bias voltage is applied to the point 1 in the signal input path and to the interconnected collector electrode of transistor Q1 and emitter electrode of transistor Q2 by way of a high value resistor R2 from a source Vr. The base electrodes of the transistors Q1 and Q2 are arranged to be biased individually by means of a bias control circuit 3. The point 1 in the input signal path is connected to the input of the low noise amplifier 2 by way of a coupling capacitor C1.

The components Q1, Q2, the control circuit 3, the capacitor C1 and the amplifier 2 may all be provided on an integrated circuit chip 4, while an LC matching circuit 5 is provided externally of the chip 4 in the radio-frequency signal path.

When the bias currents supplied by the control circuit 3 are zero, both transistors Q1 and Q2 are non-conducting, and the radio-frequency input signal is passed to the amplifier 2 without attenuation. When bias currents are supplied by the circuit 3, both the transistors Q1 and Q2 are saturated, and their small dynamic output impedance shunts the input signal to ground. The actual attenuation achieved depends upon the value of the shunt impedance.

The attenuator has two modes of operation: pre-set and variable. In the pre-set mode, the base bias currents are switched between zero and the respective values which provide the required pre-set value of attenuation. In the variable attenuation mode, the bias currents are varied either in steps or continuously to achieve the required attenuation variation.

Since the attenuator when switched off should not be the source of any significant noise power, the transistors Q1 and Q2 should each have as small an emitter area as possible for the required maximum attenuation, in order to limit noise flow from the substrate and the parasitic resistors (not shown). In this condition, the bias from the source Vr biases the junctions of the collector/base of Q1 and the emitter/base of Q2 to decrease the junction capacitances. The maximum value of this reverse bias voltage is limited by the maximum safe reverse voltage for the emitter/base junction of the transistor Q2. The value of the resistor R2 should be of the order of 10 kohm or more to minimise its noise contribution.

Figure 3:
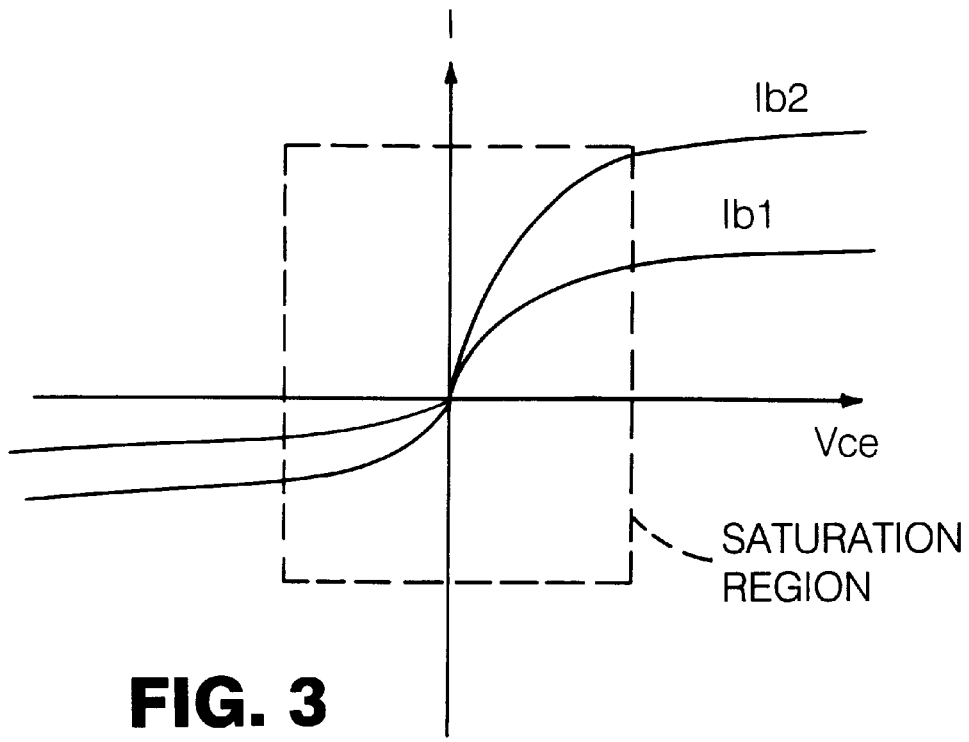
FIGS. 3 and 4 show voltage/current characteristics illustrating the operation of the attenuator of FIG. 2.
Figure 4:
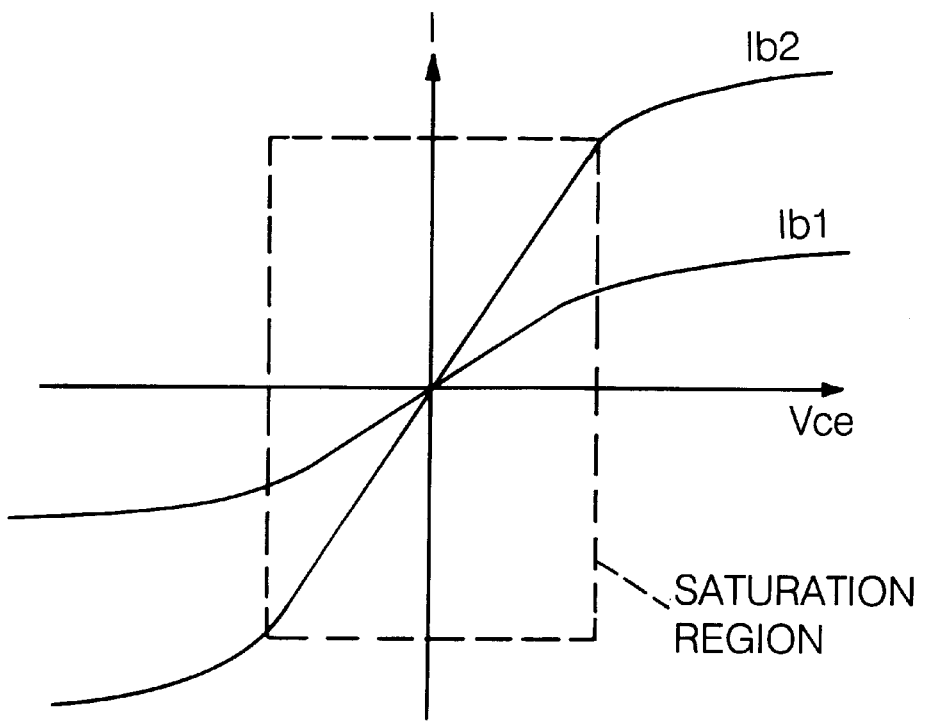

When the attenuator is switched on, it is required to be very linear. Hence the two transistors Q1 and Q2 are in reverse parallel. As shown in FIG. 3, the dynamic output impedance of a saturated transistor is relatively non-linear over the range of collector-emitter voltages from −50 mV to +50 mV, because of the big difference in the values of forward and reverse betas. The reverse parallel connection of the transistors Q1 and Q2 ensures that one of them is always in the "normal" sense of operation, while the other is operating in the inverse sense for any given polarity of radio-frequency input signal, making their combined dynamic output impedances much more linear over the range of voltages of interest, as shown in FIG. 4.

The bases of the transistors Q1 and Q2 are biased independently because the transistor operating in the inverse sense has a lower input impedance and might "steal" the majority of the bias current if the bases were connected. The output impedance of the two transistors in parallel remains linear over at least + or −100 mV across the collector-emitter paths, and the shunting current can be as high as the bias current multiplied by the forward beta. This produces linear attenuation for input signal powers up to 3–10 dBm depending on the value of attenuation. The maximum input power can be increased if a small value resistor R3 is connected in series between the point 1 and the interconnected collector and emitter electrodes of the transistors Q1, Q2 respectively. This also improves the linearity of the attenuator but, for the same maximum level of attenuation, the emitter and collector areas of the transistors Q1 and Q2 must be increased, together with the bias currents. At high frequencies, these larger areas result in higher noise flow from the substrate and the parasitic resistors.

For extending the range of attenuation it is possible to connect two or more attenuators in parallel.

To take full advantage of the benefits of the integrated attenuator, it is necessary to temperature compensate the bias currents, while for variable attenuation it is also useful to make the bias currents beta-independent.

In a particular implementation for a dual-band, digital cellular receiver front-end, with a target attenuation of 12 dB for the low gain mode of operation for the 900 MHz and 1800 MHz, the measured maximum attenuation was found to be in the range 11.1 to 11.9 dB for both bands, while the improvements in third-order intercept and 1 dB compression points were exactly proportional to the attenuation.

In the off state of the attenuator, a potential contributor of noise is the coupling capacitor C1 made on the chip. Its contribution may be minimized by layout as a strip form of capacitor with a ring contact to the substrate around it which is connected to RF ground.

The form of attenuator described above is as linear as a discrete PIN diode attenuator, but costs very little since it occupies just a small area on the chip itself, does not require any additional matching components, and its bias current is in forward beta times less than a PIN diode attenuator. In comparison with a gain-controlled low noise amplifier attenuator, it provides improvements in linearity and power handling directly proportional to the attenuation.

What is claimed is:

1. A radio-frequency variable attenuator comprising first and second bipolar transistors having their emitter/collector paths connected in reverse parallel between a point on a signal path and ground potential, with circuitry to apply a bias voltage to said point on the signal path and circuitry individually to bias the base electrodes of said first and second transistors independently of each other.

2. A radio-frequency variable attenuator in accordance with claim 1 wherein said means to apply a bias voltage to said point in said radio-frequency signal path comprises a first resistor.

3. The radio-frequency variable attenuator in accordance with claim 1, further comprising a capacitor having first and second electrodes, and an amplifier having an input and an output, the first and second electrodes of the capacitor being connected respectively to the point on the signal path and to the input of the amplifier.

4. A radio-frequency variable attenuator comprising first and second bipolar transistors each having emitter, base and collector electrodes, the collector electrode of the first transistor and the emitter electrode of the second transistor being connected together and to a point in a radio-frequency signal path, the emitter electrode of the first transistor and the collector electrode of the second transistor being connected together and to a radio-frequency signal return path, circuitry to apply a bias voltage to said point in the radio-frequency signal path and circuitry individually to bias the base electrodes of said first and second transistors independently of each other.

5. A radio-frequency variable attenuator in accordance with claim 4 wherein said means to apply a bias voltage to said point in said radio-frequency signal path comprises a first resistor.

6. A radio-frequency variable attenuator in accordance with claim 5, wherein a second resistor of small value, compared with that of said first resistor, is connected between said point and the interconnected collector electrode of said first transistor and emitter electrode of said second transistor.

7. The radio-frequency variable attenuator in accordance with claim 4, further comprising a capacitor having first and second electrodes, and an amplifier having an input and an output, the first and second electrodes of the capacitor being connected respectively to the point on the signal path and to the input of the amplifier.

* * * * *